(12) United States Patent
Saxena

(10) Patent No.: US 7,944,245 B2
(45) Date of Patent: May 17, 2011

(54) PULSE FILTERING MODULE CIRCUIT, SYSTEM, AND METHOD

(75) Inventor: Saurabh Saxena, Rajasthan (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 12/339,024

(22) Filed: Dec. 18, 2008

(65) Prior Publication Data

US 2010/0156524 A1    Jun. 24, 2010

(51) Int. Cl.
  *H03K 5/00*    (2006.01)
(52) U.S. Cl. .......................................... 327/34; 327/551
(58) Field of Classification Search .................... 327/34, 327/551–559
  See application file for complete search history.

(56) References Cited

U.S. PATENT DOCUMENTS 6,407,626 B1 * 6/2002 Carpenter et al. ............ 327/552
6,995,605 B2 * 2/2006 Hazucha et al. ............... 327/551

* cited by examiner

*Primary Examiner* — Dinh T. Le
(74) *Attorney, Agent, or Firm* — Lisa K. Jorgenson; Bryan A. Santarelli

(57) ABSTRACT

A filtering module filters out high frequency signals, primarily noise, from an input data stream. The filtering module includes an input module, a phase detecting module, and a threshold module. The input module performs either a charging or a discharging across a capacitor on a basis of an RC time constant. The phase detecting module is coupled to the input module to keep identical phase at a first node and an output node. The threshold module is coupled to the phase detecting module for providing an output signal based on a threshold voltage and the charging or the discharging across the capacitor.

17 Claims, 4 Drawing Sheets

PULSE FILTERING MODULE CIRCUIT, SYSTEM, AND METHOD

TECHNICAL FIELD

Embodiments of the present invention relate to filtering devices and more specifically to filtering modules and methods for frequency selective pulse filtering.

BACKGROUND

In communication systems there is commonly a need for frequency selective pulse filtering. Often, due to couplings, inductances, parallel switching of current sources/sinks, etc., data that reaches a receiver end is quite noisy. Also, in certain cases, where low frequency signals are used for handshaking, it becomes difficult to distinguish between data and handshaking signals traveling on the same bus. At the receiver end it becomes quite difficult to extract the data with as few errors as possible. The errors in correct detection of data could be reduced by filtering out high frequency noise components.

FIG. 1 illustrates a conventional circuit for filtering data. The circuit utilizes two symmetrical parallel paths P1 and P2 to filter an input data INP, depending on whether the input data INP is a low to high pulse or a high to low pulse. An NMOS transistor MN1 of a first inverter 102 is tuned such that it provides desired RC time constant during discharge of a capacitor C1 connected on a drain of this transistor. The corresponding PMOS transistor MP1 should be fast enough to charge the capacitor C1 completely in quite less time (depending on what could be the minimum width of an input pulse which needs to be rejected) as compared to the time RC. Hence, the PMOS transistor MP1 cannot be used to implement the charging when the input INP is varying from high to low to high again. For this purpose, the second path P2 is used. In P2, a PMOS transistor MP2 of an inverter 104 is tuned to obtain RC time constant with a capacitor C2. Then outputs of the two paths P1 and P2 are connected to cascode-connected PMOS and NMOS module 106. The module 106 is used to ensure that the slower one decides output. The data is then latched (through 108) to OUT. However, this conventional filter circuit uses a large number of switches (i.e., transistors) which consume a relatively large area and require relatively complex output control.

Therefore, there is a need for an improved filtering module and method for frequency selective pulse filtering.

SUMMARY

Embodiments of the present invention provide a filtering module for frequency selective filtering and which may be highly optimized in terms of area.

In one embodiment, a filtering module includes an input module for performing one of a charging and a discharging across a capacitor by one of a current source device and a resistor device. A phase detecting module is operatively coupled to the input module to keep identical phase at a first node and an output node. A threshold module is operatively coupled to the phase detecting module for providing an output signal based on a threshold voltage, and the charging and the discharging across the capacitor, said threshold module provides a feedback to the phase detecting module.

A further embodiment is a method for frequency selective pulse filtering that includes providing an input signal at a first node, and controlling one of a charging and a discharging across a capacitor on a basis of an RC time constant and a threshold voltage of a threshold module. If the voltage at a second node is charged above the threshold voltage, a state of the threshold module is changed. If the voltage at the second node is not charged above the threshold voltage, an original state of the filtering module is restored.

BRIEF DESCRIPTION OF THE DRAWINGS

Features of embodiments of the present invention will be explained in the following description in conjunction with the accompanying drawings, wherein.

DETAILED DESCRIPTION

Figure 1:
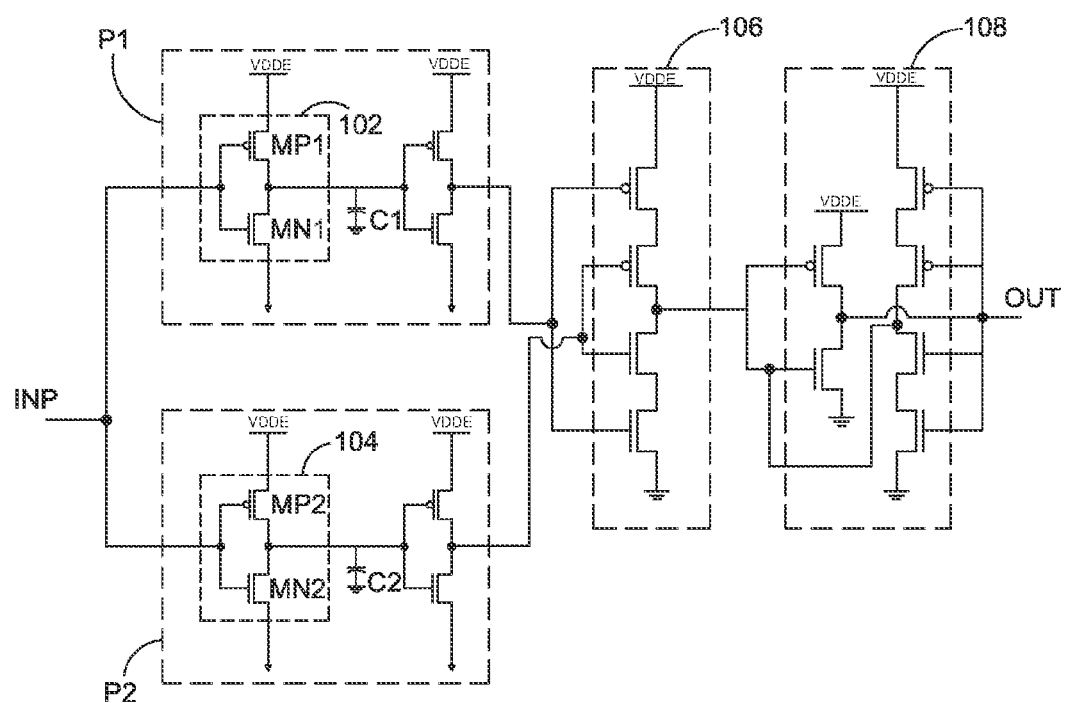
FIG. 1 illustrates a conventional circuit for filtering data.

Several example embodiments of the present invention will now be described in detail with reference to the accompanying drawings. However, the present invention is not limited to these described embodiments. The present invention can be modified in various forms and the described embodiments are only provided to enable one skilled in the art to understand various aspects of the present invention. In the accompanying drawings, like reference numerals are used to indicate like components.

Figure 2:
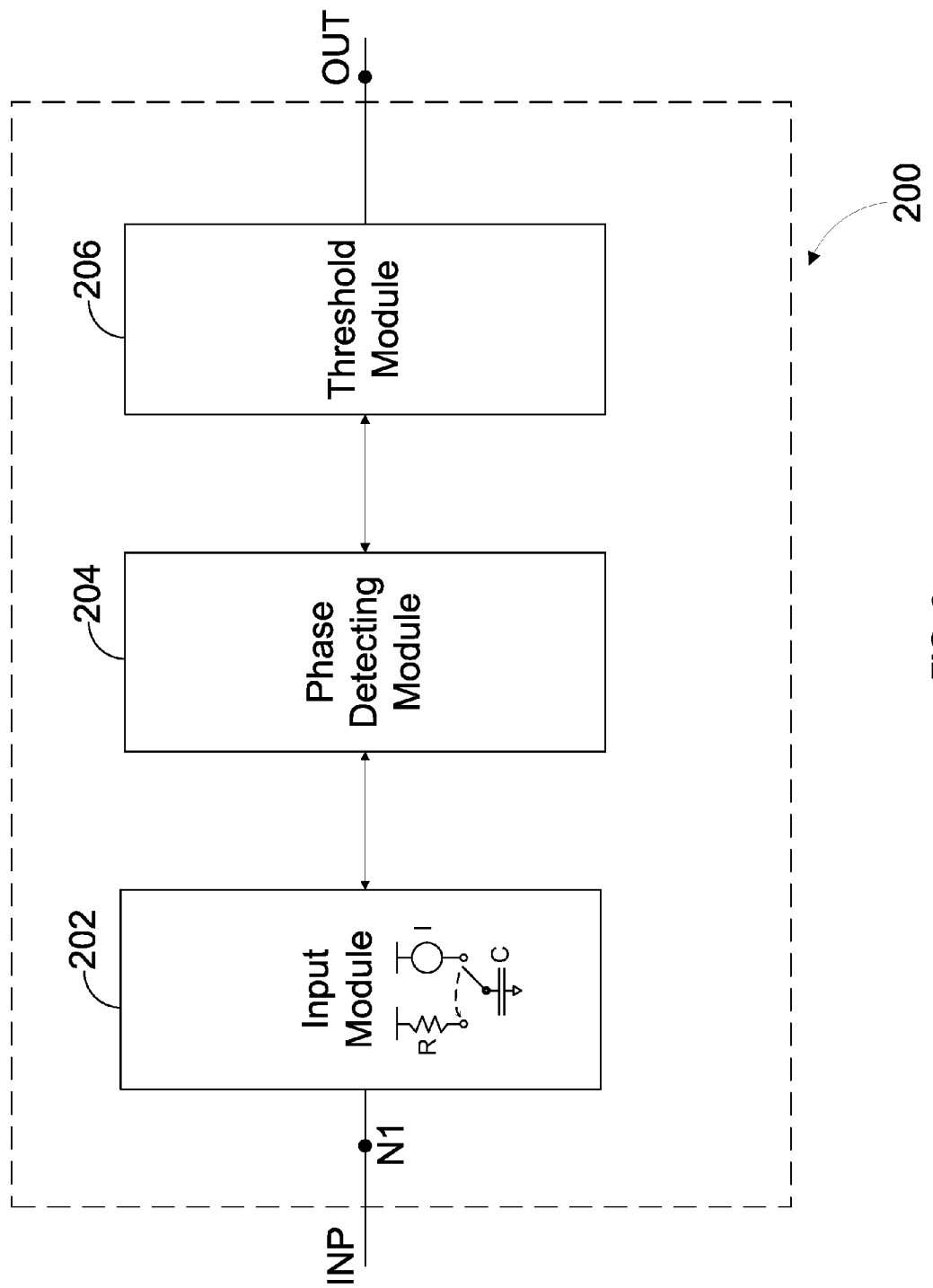
FIG. 2 illustrates a block diagram of a filtering module according to an embodiment of the present invention.

FIG. 2 illustrates a functional block diagram of a filtering module 200 according to an embodiment of the present invention. The filtering module 200 includes an input module 202, a phase detecting module 204, and a threshold module 206. The input module 202 performs either a charging or a discharging of a capacitance on a basis of a time constant. The phase detecting module 204 is coupled to the input module 202 to keep identical phase at a first node N1 and an output node OUT. The threshold module 206 is coupled to the phase detecting module 204 for providing an output signal based on a threshold voltage and the charging or the discharging across the capacitor. The threshold module 206 provides a feedback signal to the phase detecting module 204. A charging time constant is determined by charging device in the input module 202, which could be a resistor or a current source, and a circuit capacitance C. Mathematically, T=f(R×C) or f(C/I), where C stands for the circuit capacitance, R stands for a resistance which is charging the circuit capacitance C, and I stands for a current source which is charging the circuit capacitance.

Figure 3:
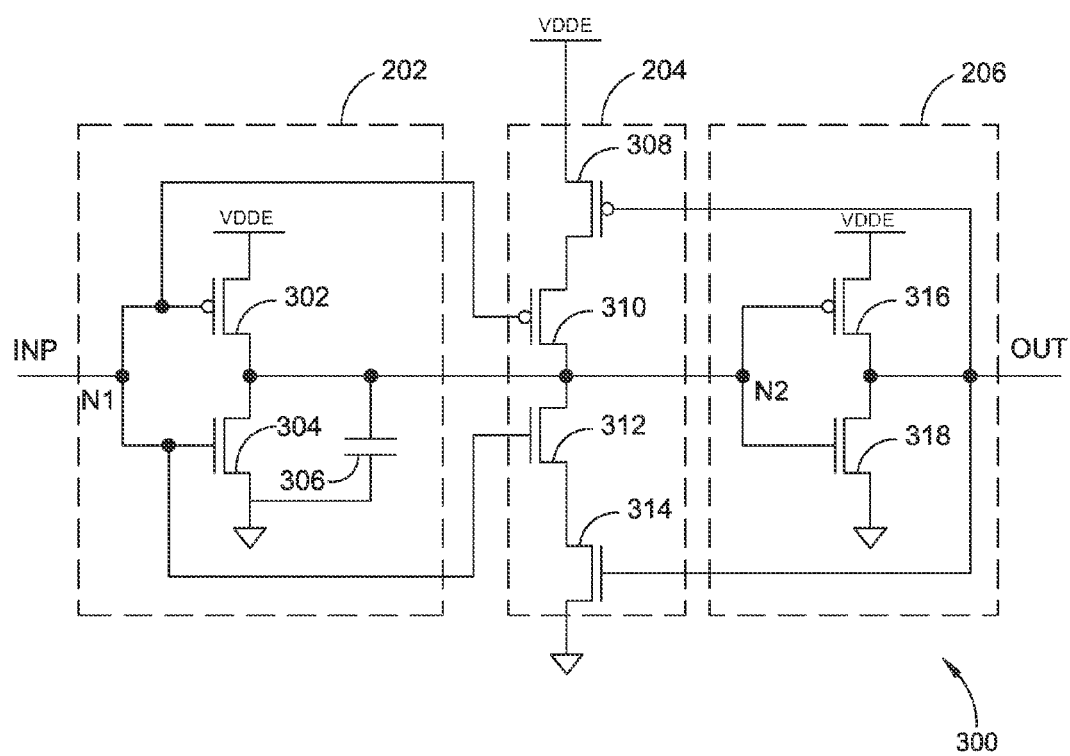
FIG. 3 illustrates a circuit diagram of a filtering module according to another embodiment of the present invention.

FIG. 3 illustrates a circuit diagram of a filtering module 300 according to another embodiment of the present invention. The input module 202 includes a first inverter formed by transistors 302, 304, and a capacitor 306. The first inverter and the capacitor 306 are coupled to each other for the charging or the discharging of the capacitor 306. The phase detecting module 204 includes two PMOS transistors 308, 310 and two NMOS transistors 312, 314. The transistors 308, 310, 312 and 314 are cascode-connected to each other. The threshold module 206 includes a second inverter formed by transistors 316, 318. The second inverter is coupled between a second node N2 and the output node OUT for controlling either the charging or the discharging across the capacitor 306.

In operation, the filtering module 300 filters out high frequency data from the input data stream on the input node INP. In an embodiment of the present invention, the filtering module 300 has feedback from the threshold module 206 to the phase detecting module 204 that enables the module 300 to filter out input data pulse widths less than 50 ns. When the input data pulse width is less than 50 ns, the module 300 restores or maintains the current state. When the input data pulse width is more than 50 ns, the module 300 quickly changes the state of the output node OUT, when appropriate.

In an embodiment of the present invention, if the first node N1 is provided a supply voltage VDDE then the transistor 304 turns ON because the gate terminal of the transistor 304 is at VDDE. This pulls down the second node N2 to a ground voltage GNDE. Thus, due to the second inverter, the output node OUT goes high. The transistor 312 and the transistor 314 turn ON because the first node N1 and the output node OUT are high. Hence the transistors 308, 310, 312, 314, 316, and 318 form a latch in DC mode and keep the output node OUT at a high.

If the first node N1 goes down, then the transistor 304 turns OFF while transistor 302 turns ON and starts charging the capacitor 306. Thus, the voltage at the second node N2 starts rising. The transistor 310 turns ON and the transistor 312 turns OFF because the voltage at the first node N1 is going down. But the output node OUT is still at high because of initialization. The output node OUT remains at high until the voltage at second node N2 crosses above the threshold voltage of the inverter (comprising transistors 316 and 318). Until this time, the latch formed by transistors 308, 310, 312, 314, 316 and 318 is disabled as OUT and INP are out of phase, hence breaking the feedback path. Now the following two conditions could be present in the module 300, depending on the frequency of the signal at INP.

Firstly, time for charging the second node N2 is adequate to increase the voltage at the second node N2 above the threshold level of the inverter (comprising transistors 316 and 318). The second node N2 is charged by only the transistor 302 because the transistor 308 is OFF and not helping the node N2 in charging through the transistor 310. The node N2 is not discharged by any path despite transistor 314 being ON as the OUT node is high because 304 and 312 are OFF due to the INP node being low. As the voltage at the second node N2 rises above the threshold level, the output node OUT toggles (i.e., goes low in this example). This allows transistor 308 to turn ON and 314 to turn OFF. The transistor 310 is already ON since the node INP is low. Thus, the second node N2 quickly charges up to VDDE through transistors 308 and 310. The latch accordingly settles in the new state with a low at output node OUT.

Secondly, in the case the input signal goes back to its initial state before the second node N2 is charged over the threshold level of the inverters 316 and 318, the transistor 302 turns OFF and the transistors 304 and 312 turn ON. Since 314 was already ON due to the OUT node being high, as soon as 312 turns ON, the capacitor 306 is quickly discharged through the path comprising transistors 312 and 314. Hence discharging of the capacitor 306 is primarily determined by the transistors 312 and 314. The transistor 304 is ON but the size of this transistor is small as it is also implementing the resistor which determines the RC time constant for discharging time of N2. Hence, the transistor 304/302 could not be sized to arbitrarily large values. The transistors present in the phase detection module 204 serve two primary purposes. One is the phase detection and second is fast pull up or down of node N2 once the phases of OUT and INP are same. The time for charging (or discharging) the capacitor 306 to the threshold level or levels of the inverters 316, 318 determines the highest frequency of the filtering module. This could be controlled by relative sizing of the transistors 302, 304, and the capacitor 306.

Figure 4:
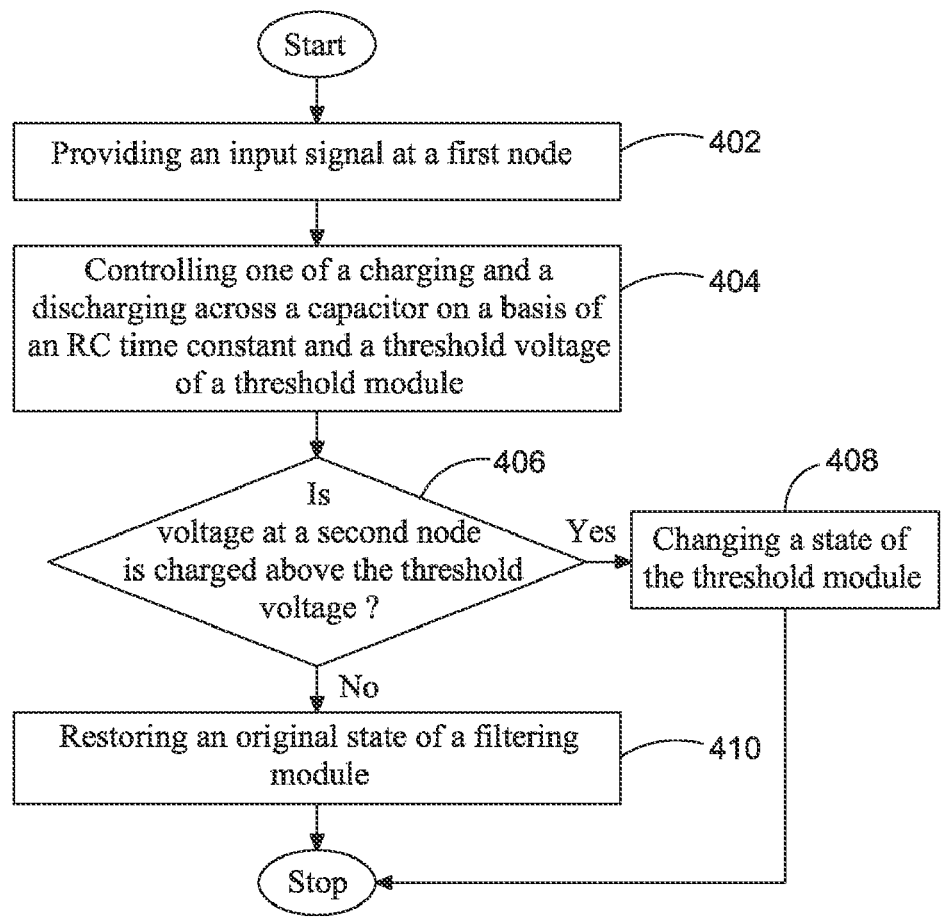
FIG. 4 illustrates a flow diagram of a method according to an embodiment of the present invention.

FIG. 4 illustrates a flow diagram of a method for frequency selective pulse filtering according to an embodiment of the present invention. At step 402, an input signal is provided at a first node N1. At step 404, a charging or a discharging across a capacitor 306 is controlled on a basis of an RC time constant and a threshold voltage of a threshold module 206. At step 406, the method checks whether the voltage at a second node N2 is charged above the threshold voltage. At step 408, a state of the threshold module 206 is changed when the voltage at the second node N2 is charged above the threshold voltage. At step 410, an original state of a filtering module 200 is restored or discharged below when the voltage at the second node N2 is not charged above or discharged below the threshold voltage.

The above embodiments of the invention, and others as well, are related to a filtering module that can be used in various applications, such as an input section of an I/O buffer based on I2C bus standard and other electronic circuits. Moreover, such circuits can be contained in a variety of different types of electronic systems and devices, such as computer systems, portable devices like cellular telephones, personal digital assistants, and portable media (audio, video) playing devices, as well as others, as will be appreciated by those skilled in the art.

Embodiments of the present invention can be highly optimized in terms of area and number of devices. Moreover, embodiments of the present invention can consume less current than prior art circuits. Also, the design of at least some embodiments is efficient in terms of providing a high degree of controllability and less complexity.

Although the disclosure filtering modules, methods, and systems has been described in connection with the above example embodiments of the present invention illustrated in the accompanying drawings, it is not limited thereto. It will be apparent to those skilled in the art that various substitutions, modifications and changes may be made thereto without departing from the scope and spirit of the disclosure.

We claim:

1. A filtering module, comprising:
an input module operable to perform one of a charging and a discharging of a capacitance by one of a current source device and a resistive device;
a phase detecting module operatively coupled to the input module and operable to keep identical phases at an input node of the input module and at an output node; and
a threshold module operatively coupled to the phase detecting module and operable to provide an output signal on the output node based on a threshold voltage and the charging and the discharging of the capacitance, and the threshold module further operable to provide a feedback signal to the phase detecting module.

2. The filtering module of claim 1, wherein the input module comprises a first inverter operatively coupled to the capacitance for the charging and the discharging of the capacitance.

3. The filtering module of claim 1, wherein the phase detecting module comprises two PMOS transistors and two NMOS transistors being cascode-connected to each other.

4. The filtering module of claim 1, wherein the threshold module comprises a second inverter operatively coupled between a second node connected to the capacitance and the output node and operable to control the charging and the discharging of the capacitance.

5. A method for frequency selective pulse filtering, comprising:
in response to an input signal, controlling one of a charging and a discharging of a node on the basis of a time constant and a threshold voltage;

if a voltage at the node is charged above the threshold voltage within a time determined by the time constant, changing a state of an output signal; and if the voltage at the node is not charged above the threshold voltage within the time determined by the time constant, restoring an original state of the voltage on the node and maintaining an original state of the output signal.

6. A filtering module, comprising:

an input module operable responsive to a first input signal on a first input node to alternately charge and discharge a capacitive element at respective rates and to develop a first output signal across the capacitive element on a first output node;

a phase detecting module connected to the input node of the input module to receive the first input signal and connected to the first output node of the input module, the phase detecting module operable responsive to the first input signal and a second output signal to charge or discharge the capacitive element of the input module and responsive to thereby drive the first output signal to either a first level or a second level; and a threshold module connected to the first output node of the input module and to the phase detecting module, the threshold module having a second output node and connected to being operable responsive to the first output signal on the first output node reaching a threshold value to drive the second output signal on the second output node to a first level or a second level.

7. The filtering module of claim 6, wherein the phase detecting module is operable to charge the capacitive element and thereby drive the first output signal across the capacitive element of the input module to the first level responsive to the second output signal on the second output node being driven to the same level as a level of the first input signal.

8. The filtering module of claim 6, wherein the threshold detection circuit comprises an inverter and wherein the threshold value of the first output signal corresponds to an activation threshold or thresholds of the inverter.

9. The filtering module of claim 6, wherein the first level corresponds substantially to a value of a first supply voltage and wherein the second level corresponds substantially to a value of a first reference voltage.

10. The filtering module of claim 6, wherein the established rates at which the capacitive element is charged and discharged are selected to prevent first inputs signals having a frequency greater than a desired value from causing the filtering module to change the state of the second output signal.

11. The filtering module of claim 6, wherein the capacitive element comprises a single capacitor.

12. The filtering module of claim 6, wherein the input module comprises a first inverter having an inverter input node coupled to the first input node and an inverter output node coupled to the first output node; and wherein the capacitive element is coupled between the inverter output node and a reference supply voltage source.

13. The filtering module of claim 12, wherein the phase detecting module comprises two NMOS and two PMOS cascade-connected transistors.

14. The filtering module of claim 13, wherein the transistors in the phase detecting module are larger than the transistors forming the first inverter of the input module.

15. The filtering module of claim 14, wherein the threshold module comprises a second inverter having an inverter input node coupled to the first output node and an inverter output node coupled to the second output node.

16. An electronic system, comprising:

electronic circuitry; and a filtering module coupled to the electronic circuitry, the filtering module comprising, an input module operable responsive to a first input signal on a first input node to alternately charge and discharge a capacitive element at established rates and to develop a first output signal across the capacitive element on a first output node;

a phase detecting module coupled to the input module to receive the first input signal and coupled to the first output node of the input module, the phase detecting module operable responsive to the first input signal and a second output signal to charge or discharge the capacitive element of the input module and to thereby drive the first output signal to either a first level or a second level; and a threshold module coupled to the first output node of the input module and to the phase detecting module, the threshold module having a second output node and being operable responsive to the first output signal on the first output node reaching a threshold value to drive the second output signal on the second output node to the first level or second level and to feed back the second output signal to the phase detecting module.

17. The electronic system of claim 16, wherein the electronic circuitry comprises one of computer circuitry, personal digital assistant circuitry, portable media player circuitry, and cellular telephone circuitry.

* * * * *